(12) United States Patent
Yamakawa et al.

(10) Patent No.: US 7,766,218 B2
(45) Date of Patent: Aug. 3, 2010

(54) PASTY SILVER PARTICLE COMPOSITION, PROCESS FOR PRODUCING SOLID SILVER, SOLID SILVER, JOINING METHOD, AND PROCESS FOR PRODUCING PRINTED WIRING BOARD

(75) Inventors: Kimio Yamakawa, Ichihara-shi (JP); Katsutoshi Mine, Ichihara-shi (JP)

(73) Assignee: Nihon Handa Co., Ltd., Tokyo (JP)

( * ) Notice: Subject to any disclaimer, the term of this patent is extended or adjusted under 35 U.S.C. 154(b) by 163 days.

(21) Appl. No.: 12/067,648

(22) PCT Filed: Sep. 20, 2006

(86) PCT No.: PCT/JP2006/318633
§ 371 (c)(1),
(2), (4) Date: Mar. 20, 2008

(87) PCT Pub. No.: WO2007/034833
PCT Pub. Date: Mar. 29, 2007

(65) Prior Publication Data
US 2009/0236404 A1    Sep. 24, 2009

(30) Foreign Application Priority Data
Sep. 21, 2005  (JP) .............................. 2005-274240
Oct. 24, 2005  (JP) .............................. 2005-309126

(51) Int. Cl.
*B23K 31/02* (2006.01)
*B23K 35/34* (2006.01)
(52) U.S. Cl. .................... 228/248.1; 228/233.2; 148/24
(58) Field of Classification Search .................. None
See application file for complete search history.

(56) References Cited

U.S. PATENT DOCUMENTS

| | | | | |
|---|---|---|---|---|
| 5,914,358 | A * | 6/1999 | Kawakita et al. | 523/458 |
| 2004/0248998 | A1* | 12/2004 | Honda et al. | 516/98 |
| 2005/0167640 | A1* | 8/2005 | Matsushima et al. | 252/512 |
| 2005/0194577 | A1* | 9/2005 | Kasuga et al. | 252/514 |
| 2005/0257643 | A1* | 11/2005 | Ogi et al. | 75/255 |
| 2005/0279970 | A1* | 12/2005 | Ogi et al. | 252/514 |

(Continued)

FOREIGN PATENT DOCUMENTS

JP    2001-107101 A    4/2001

(Continued)

*Primary Examiner*—Kiley Stoner
(74) *Attorney, Agent, or Firm*—Knobbe Martens Olson & Bear LLP

(57) ABSTRACT

To provide a pasty silver particle composition, which, upon heating, allows silver particles to be easily sintered to form solid silver possessing excellent strength, electric conductivity and thermal conductivity, and a production process of solid silver and the like. A pasty silver particle composition comprising nonspherical silver particles having an average particle diameter of 0.1 to 18 μm and a carbon content of not more than 1.0% by weight and a volatile dispersion medium, wherein, upon heating, the volatile dispersion medium is volatilized and the nonspherical silver particles are sintered to one another to form solid silver. There are also provided a process for producing solid silver comprising heating the pasty silver particle composition, solid silver having excellent strength, electric conductivity and thermal conductivity, a method for joining a metallic member using the pasty silver particle composition, and a production process of a printed wiring board comprising silver wiring.

11 Claims, 1 Drawing Sheet

U.S. PATENT DOCUMENTS

| | | |
|---|---|---|
| 2006/0011267 A1* | 1/2006 | Kay et al. .................... 148/23 |
| 2006/0145125 A1* | 7/2006 | Kuwajima et al. .......... 252/500 |
| 2007/0181858 A1* | 8/2007 | Matsushima et al. ........ 252/500 |
| 2007/0183920 A1* | 8/2007 | Lu et al. ...................... 419/9 |
| 2009/0127518 A1* | 5/2009 | Nagano et al. .............. 252/514 |
| 2009/0146117 A1* | 6/2009 | Suenaga et al. .......... 252/520.3 |
| 2009/0162448 A1* | 6/2009 | Dunwoody et al. ......... 424/490 |

FOREIGN PATENT DOCUMENTS

| | | |
|---|---|---|
| JP | 2004-87495 A | 3/2004 |
| JP | 2004-355933 A | 12/2004 |
| JP | 2005-93380 A | 4/2005 |
| JP | 2005-216508 A | 8/2005 |
| JP | 2006-49147 A * | 2/2006 |
| WO | WO 91/17840 A1 | 11/1991 |

* cited by examiner

PASTY SILVER PARTICLE COMPOSITION, PROCESS FOR PRODUCING SOLID SILVER, SOLID SILVER, JOINING METHOD, AND PROCESS FOR PRODUCING PRINTED WIRING BOARD

REFERENCE TO RELATED APPLICATIONS

The present application is the U.S. National Phase of International Application PCT/JP2006/318633, filed Sep. 20, 2006 and claims priority to Japanese Patent Application Number 2005-274240, filed Sep. 21, 2005 and Japanese Patent Application Number 2005-309126, filed Oct. 24, 2005. Each of the priority applications is hereby incorporated by reference in its entirety.

TECHNICAL FIELD

The present invention relates to a pasty silver particle composition that comprises non-spherical silver particles and a volatile dispersion medium and is sintered by heating to become solid silver having excellent strength, electrical conductivity, and thermal conductivity; a process for producing solid silver from the pasty silver particle composition; solid silver having excellent strength, electrical conductivity, and thermal conductivity; a method for joining silver member using the pasty silver particle composition; and a process for producing a printed wiring board.

BACKGROUND ART

An electrically conductive paste made by dispersing a silver powder in a thermosetting resin composition is cured by heating to form an electrically conductive film, therefore it is used for the formation of an electrically conductive circuit on a printed circuit substrate; the formation of the electrodes of various display elements and various electronic components, such as a resistor and a capacitor; the formation of an electrically conductive film for an electromagnetic wave shield; the adhesion of a chip component, such as a capacitor, a resistor, a diode, a memory, and an arithmetic element (CPU), to a substrate; the formation of the electrodes of a solar cell, particularly, the electrodes of a solar cell using an amorphous silicon semiconductor that cannot be treated at high temperature; the formation of the external electrode of a chip-type ceramic electronic component, such as a laminated ceramic capacitor, a laminated ceramic inductor, and a laminated ceramic actuator; and the like.

Recently, because of high performance of chip components, the amount of heat generation from the chip components increases, therefore, an improvement in thermal conductivity as well as electrical conductivity has been required. Therefore, it is considered that electrical conductivity and thermal conductivity are improved by increasing the content of silver particles as much as possible, but there is the problem that the viscosity of the electrically conductive paste increases, significantly decreasing workability.

On the other hand, a highly-dispersible spherical silver powder optimal for producing an electrically conductive paste that can form the electrodes and circuits of chip components, plasma display panels, and the like, with high density, high precision, and high reliability; and a silver paste using the same are taught in Patent Document 1. Also, as a method for applying an electrically conductive paste to a circuit board, an ink jet method, in addition to a screen printing method, has begun to be used. Therefore, a silver ink comprising a silver powder in which the average particle diameter $D_{IA}$ of primary particles obtained by the image analysis of a scanning electron microscope image is 0.6 µm or less, polyols, and further a viscosity-adjusting agent and the like as required is proposed (see Patent Document 2).

In Patent Document 1, a silver powder is prepared by mixing and reacting an aqueous solution of silver nitrate and aqueous ammonia to prepare an aqueous solution of a silver ammine complex, contacting and reacting this aqueous solution of a silver ammine complex and an aqueous solution of hydroquinone, anhydrous potassium or ammonium sulfite, and gelatin to precipitate a silver powder by reduction, filtering this reaction liquid, washing the residue with water, and drying it by heating. Patent Document 1 describes that thus prepared silver powder was used to prepare a silver paste, but its formulation is unclear. Then, when the present inventors mixed the silver powder with a small amount of water to make them pasty and heated, it was found that there were the problem that the silver powder was not sintered sufficiently and the problem that even if it was sintered to produce solid silver, strength, electrical conductivity, and thermal conductivity were unexpectedly low. In Patent Document 2, a silver powder is prepared by mixing and reacting an aqueous solution of silver nitrate and aqueous ammonia to prepare an aqueous solution of a silver ammine complex, contacting and reacting this aqueous solution of a silver ammine complex and an organic reducing agent (such as hydroquinone, ascorbic acid, and glucose), particularly an aqueous solution of hydroquinone, to precipitate a silver powder by reduction, filtering this reaction liquid, washing the residue with water and methanol, and drying it by heating. However, when the present inventors heated a silver ink comprising thus prepared silver powder and polyols (for example, 1,4-butanediol, dipropylene glycol), it was found that there were the problem that the silver powder was not sintered sufficiently and the problem that if it was sintered to produce solid silver, strength, electrical conductivity, and thermal conductivity were unexpectedly low.

Patent Document 1: Japanese Patent Laid-Open No. 2001-107101, i.e., JP 2001-107101 A Patent Document 2: Japanese Patent Laid-Open No. 2005-93380, i.e., JP 2005-93380 A As a result of studying diligently to develop a silver paste, that is, a pasty silver particle composition without the above problems, the present inventors have found that the shape, particle diameter, and carbon content in silver particles and a coating agent for the silver surface affect the sintering property of the silver particles, and the strength, electrical conductivity, and thermal conductivity of solid silver produced by sintering, to complete the present invention. An object of the present invention is to provide a pasty silver particle composition in which silver particles are easily sintered by heating to provide solid silver having excellent strength, electrical conductivity, and thermal conductivity; a process for producing solid silver having excellent strength, electrical conductivity, and thermal conductivity from the pasty silver particle composition; solid silver having excellent strength, electrical conductivity, and thermal conductivity; a method for joining metal members strongly with good electrical conductivity and thermal conductivity, using the pasty silver particle composition; and a process for producing a printed wiring board having silver wiring having excellent wear resistance, adhesive property to the substrate, electrical conductivity, and thermal conductivity.

DISCLOSURE OF THE INVENTION

This object is achieved by the followings.

[1] A pasty silver particle composition, characterized by comprising (A) non-spherical silver particles having an average particle diameter of 0.1 to 18 μm and a carbon content of 1.0 weight % or less; and (B) a volatile dispersion medium, the volatile dispersion medium being volatilized and the non-spherical silver particles being sintered by heating.

[2] The pasty silver particle composition according to [1], characterized in that the non-spherical silver particles (A) are flake-like silver particles or granular silver particles.

[3] The pasty composition according to [1], characterized in that the surface of the silver particles is at least partially coated with a higher fatty acid or its derivative.

[4] The pasty composition according to [2], characterized in that the surface of the silver particles is at least partially coated with a higher fatty acid or its derivative.

[5] The pasty silver particle composition according to [1], [2], [3], or [4], characterized in that the volatile dispersion medium (B) is a volatile hydrophilic solvent or aliphatic hydrocarbon solvent.

[6] The pasty silver particle composition according to [5], characterized in that the volatile hydrophilic solvent is a volatile alcohol or a mixture of volatile alcohol and water.

[7] A process for producing solid silver, characterized by comprising heating the pasty silver particle composition according to [1], [2], [3], or [4] at 100° C. or higher and 400° C. or lower, whereby the volatile dispersion medium is volatilized and the silver particles are sintered.

[8] A process for producing solid silver, characterized by comprising heating the pasty silver particle composition according to [5] at 100° C. or higher and 400° C. or lower, whereby the volatile dispersion medium is volatilized and the silver particles are sintered.

[9] A process for producing solid silver, characterized by comprising heating the pasty silver particle composition according to [6] at 100° C. or higher and 400° C. or lower, whereby the volatile dispersion medium is volatilized and the silver particles are sintered.

[10] Solid silver characterized in that solid silver produced by the producing process according to [7] has a volume resistivity of $1\times10^{-4}$ Ω·cm or less and a thermal conductivity of 5 W/m·K or more.

[11] Solid silver characterized in that the solid silver produced by the producing method according to [8] has a volume resistivity of $1\times10^{-4}$ Ω·cm or less and a thermal conductivity of 5 W/m·K or more.

[12] Solid silver characterized in that the solid silver produced by the producing process according to [9] has a volume resistivity of $1\times10^{-4}$ Ω·cm or less and a thermal conductivity of 5 W/m·K or more.

[13] A joining method characterized by comprising interposing the pasty silver particle composition according to [1], [2], [3], or [4] between a plurality of metal members and heating at 100° C. or higher and 400° C. or lower, whereby the volatile dispersion medium is volatilized and the silver particles are sintered to join the plurality of metal members.

[14] A joining method characterized by comprising interposing the pasty silver particle composition according to [5] between a plurality of metal members and heating at 100° C. or higher and 400° C. or lower, whereby the volatile dispersion medium is volatilized and the silver particles are sintered to join the plurality of metal members.

[15] A joining method characterized by comprising interposing the pasty silver particle composition according to [6] between a plurality of metal members and heating at 100° C. or higher and 400° C. or lower, whereby the volatile dispersion medium is volatilized and the silver particles are sintered to join the plurality of metal members.

[16] The joining method according to [13], characterized in that the plurality of metal members are an electrode on a metal substrate or an electrically insulating substrate, and a metal portion of an electronic component or an electrical component.

[17] The joining method according to [14], characterized in that the plurality of metal members are an electrode on a metal substrate or an electrically insulating substrate, and a metal portion of an electronic component or an electrical component.

[18] The joining method according to [15], characterized in that the plurality of metal members are an electrode on a metal substrate or an electrically insulating substrate, and a metal portion of an electronic component or an electrical component.

[19] A process for producing a printed wiring board, characterized by comprising applying the pasty silver particle composition according to [1], [2], [3], or [4] on a substrate, to which an adhesive is applied, and heating at 100° C. or higher and 400° C. or lower before the adhesive is cured, whereby the volatile dispersion medium is volatilized and the silver particles are sintered and simultaneously the adhesive is cured to form silver wiring.

[20] A process for producing a printed wiring board, characterized by comprising applying the pasty silver particle composition according to [5] on a substrate, to which an adhesive is applied, and heating at 100° C. or higher and 400° C. or lower before the adhesive is cured, whereby the volatile dispersion medium is volatilized and the silver particles are sintered and simultaneously the adhesive is cured to form silver wiring.

[21] A process for producing a printed wiring board, characterized by comprising applying the pasty silver particle composition according to [6] on a substrate, to which an adhesive is applied, and heating at 100° C. or higher and 400° C. or lower before the adhesive is cured, whereby the volatile dispersion medium is volatilized and the silver particles are sintered and simultaneously the adhesive is cured to form a silver wiring.

In the pasty silver particle composition of the present invention, the volatile dispersion medium (B) is volatilized by heating, and the non-spherical silver particles (A) are sintered by heating particularly at 100° C. or higher and 400° C. or lower to provide solid silver having excellent strength, electrical conductivity, and thermal conductivity.

According to the process for producing solid silver according to the present invention, the volatile dispersion medium (B) is volatilized by heating, and the non-spherical silver particles (A) are sintered by heating particularly at 100° C. or higher and 400° C. or lower, so that solid silver having excellent strength, electrical conductivity, and thermal conductivity can be obtained.

The solid silver of the present invention has strength and electrical conductivity comparable to those of silver produced by a smelting method.

According to the joining method of the present invention, the volatile dispersion medium (B) is volatilized and the non-spherical silver particles (A) are sintered by heating, so that a plurality of metal members can be joined strongly with good electrical conductivity and thermal conductivity.

According to the process for producing a printed wiring board according to the present invention, the volatile dispersion medium (B) is volatilized and the non-spherical silver particles (A) are sintered by heating, so that a printed wiring board having silver wiring having excellent wear resistance, adhesive property to the substrate, electrical conductivity, and thermal conductivity can be obtained. Also, according to the above joining method, a circuit board can be produced by mounting a chip and the like on the printed wiring board.

DESCRIPTION OF SYMBOLS

Figure 1:
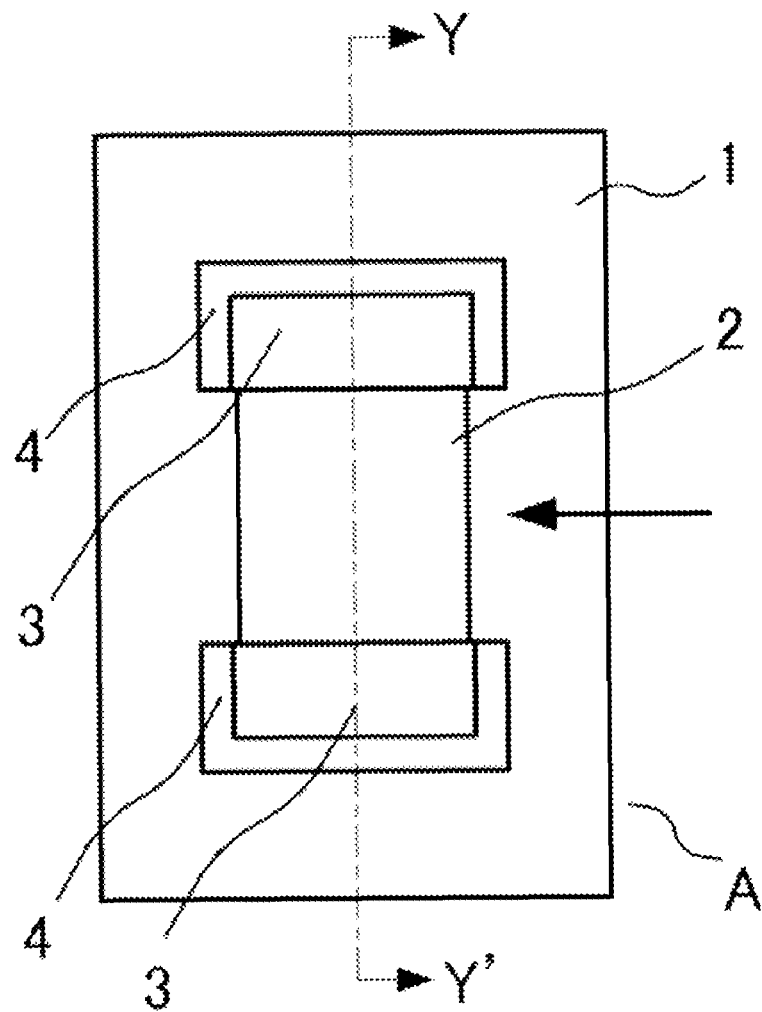
FIG. 1 is a plan view of specimen A for adhesive strength measurement in examples. A chip capacitor 2 is mounted on a glass fiber-reinforced epoxy resin substrate 1 by joining terminal electrodes 3 of the chip capacitor and substrate land (pad) portions 4.
Figure 2:
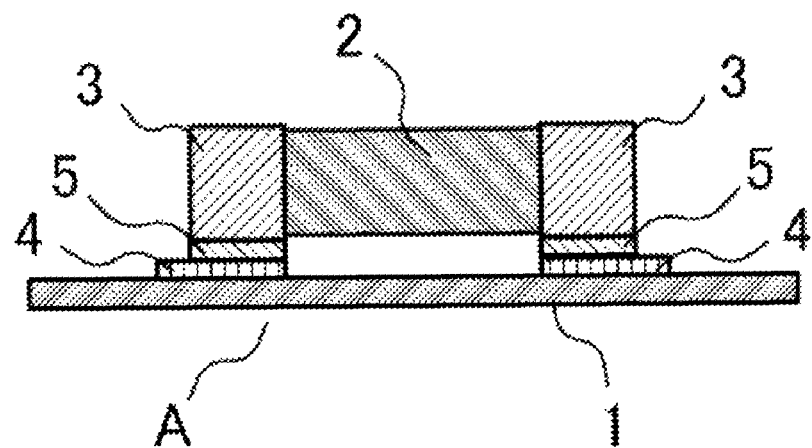
FIG. 2 is a cross section along line Y-Y' in FIG. 1.

A: a specimen for adhesive strength measurement
1: a glass fiber reinforced epoxy resin substrate
2: a 2012 chip capacitor
3: the terminal electrode of the 2012 chip capacitor
4: a substrate land (pad) portion
5: solid silver

BEST MODE FOR CARRYING OUT THE INVENTION

The pasty silver particle composition of the present invention comprises (A) non-spherical silver particles having an average particle diameter of 0.1 to 18 μm and a carbon content of 1.0 weight % or less; and (B) a volatile dispersion medium. The average particle diameter of the silver particles is the average particle diameter of primary particles obtained by a laser diffraction scattering-type particle size distribution measurement method. If the average particle diameter is more than 18 μm, the sintering property of the non-spherical silver is low, so that excellent strength, electrical conductivity, thermal conductivity, and adhesive property are not easily obtained. Therefore, a smaller average particle diameter is more preferable, and particularly, 5 μm or less is preferable. If the average particle diameter is less than 0.1 μm, so-called nano size, the surface activity is too strong, so that the storage stability of the pasty silver particle composition might decrease; therefore, the average particle diameter is 0.1 μm or more.

Silver particles in the pasty silver particle composition of the present invention should be non-spherical. Flake-like, needle-like, horn-like, dendritic, granular, irregular-shaped, teardrop-like, plate-like, very thin plate-like, hexagonal plate-like, column-like, rod-like, porous, fibrous, lump-like, sponge-like, angular, and round silver particles and the like are illustrated. Flake-like, needle-like, horn-like, dendritic, granular, irregular-shaped, teardrop-like, plate-like, very thin plate-like, and hexagonal plate-like silver particles are preferable, and flake-like or granular silver particles are more preferable.

A method for producing the non-spherical silver particles (A) is not limited, and a reduction method, a milling method, an electrolysis method, an atomization method, a heat treatment method, and a method of combination thereof are illustrated. As a method for producing flake-like silver particles, there is a producing method in which spherical or granular particles made by a reduction method are turned into flakes. As described in the above patent documents, in the reduction method, usually, a silver powder is prepared by mixing and reacting an aqueous solution of silver nitrate and aqueous ammonia to prepare an aqueous solution of a silver ammine complex, contacting and reacting this aqueous solution of a silver amine ammine complex and an aqueous solution of hydroquinone, anhydrous potassium or ammonium sulfite, and gelatin to precipitate a silver powder by reduction, filtering this reaction liquid, washing the residue with water, and drying it by heating. Alternatively, a silver powder is prepared by mixing and reacting an aqueous solution of silver nitrate and aqueous ammonia to prepare an aqueous solution of a silver ammine complex, contacting and reacting this aqueous solution of a silver ammine complex and an organic reducing agent (such as hydroquinone, ascorbic acid, and glucose), particularly an aqueous solution of hydroquinone, to precipitate a silver powder by reduction, filtering this reaction liquid, washing the residue with water and methanol, and drying it by heating. The filtration residue contains ammonia, hydroquinone, anhydrous potassium or ammonium sulfite, and gelatin, and ammonia, hydroquinone, anhydrous potassium or ammonium sulfite, and gelatin are attached to the surface of the silver particles, therefore, it is usually washed repeatedly with clean water. Alternatively, the filtration residue contains ammonia and the organic reducing agent, particularly hydroquinone, and ammonia and the organic reducing agent, particularly hydroquinone, are attached to the surface of the silver particles, therefore, it is usually washed repeatedly with clean water and methanol.

Thus obtained powdery silver particles can be turned into flakes by a usual method. The powdery silver particles can be easily processed into flake-like silver particles by introducing the powdery silver particles, with ceramic balls, into a drum in a rotary drum apparatus, such as a ball mill, and rotating the drum to physically hit the silver particles. At this time, a trace amount of a higher fatty acid having 10 or more carbon atoms or its derivative may be added to reduce the aggregation of the silver particles and to prevent the aggregation. As such higher fatty acid, lauryl acid, myristyl acid, palmitic acid, stearic acid, oleic acid, linoleic acid, and linolenic acid are illustrated. As a derivative of a higher fatty acid, a higher fatty acid metal salt, higher fatty acid ester, and higher fatty acid amide are illustrated. Among these, higher saturated fatty acid is preferable. As such higher saturated fatty acid, lauryl acid, myristyl acid, palmitic acid, and stearic acid are illustrated. Part or all of the surface of the flake-like silver particles is coated with such higher fatty acid. Flake-like silver particles with all of the silver surface coated with a higher fatty acid or the like usually exhibit water repellency.

The carbon content in the non-spherical silver particles is 1.0 weight % or less in terms of the sintering property of the non-spherical silver particles during heating, and the strength, electrical conductivity, and thermal conductivity of solid silver made by sintering. Here, the carbon content can be obtained by heating the non-spherical silver particles in an oxygen gas flow to turn the carbon in the organic compound attached to the silver particles into a carbon dioxide gas, measuring the amount of the carbon dioxide gas by an infrared absorption spectrum method, and converting the amount of the carbonic acid gas into a carbon content. Commercially available non-spherical silver particles are intended for electrically conductive pastes comprising thermosetting resin, such as epoxy resin, as a vehicle, so that their carbon content is not controlled, therefore it is not easy to find one having a carbon content of 1.0 weight % or less. Therefore, it can barely be found by examining the carbon content for many product numbers.

For thus obtained non-spherical silver particles, their carbon content is 1.0 weight % or less, the sintering property of the silver particles, during heating at a temperature of 100° C. or higher and 400° C. or lower, is excellent, and the strength, electrical conductivity, and thermal conductivity of solid silver made by sintering are excellent. The surface of the non-spherical silver particles may be somewhat oxidized. If the proportion of silver oxide is high, a large amount of oxygen is generated during heating, which can be a cause of the generation of voids in solid silver made by sintering, therefore, the proportion of silver oxide in the surface is preferably 50% or less of the entire surface of the non-spherical silver particles, particularly preferably 20% or less, and more preferably 2% or less. If silver oxide is present in silver particles contained in a die-bonding agent, voids are generated in solid silver made by sintering to decrease the adhesive strength. Therefore, the presence of silver oxide is not preferable, because when a large chip, such as a memory and a CPU, is joined to a substrate, the joining area of the die-bonding agent is relatively large, and yet a semi-closed system is provided.

As a method for producing very thin plate-like silver particles, a wet neutralization reduction method is illustrated. Specifically, it is a method in which a slurry of an ammine complex of silver salt and an aqueous solution of a reducing agent selected from the group consisting of water-soluble sulfite and glucose are mixed at a time to reduce the ammine complex of silver salt, and produced silver particles are recovered. There is a method for producing very thin plate-like silver particles by making a particular protective colloid exist, controlling the concentration of the protective colloid particles, and controlling the concentration of an ammine complex of silver salt, when a slurry of the ammine complex of silver salt and an aqueous solution of water-soluble sulfite are mixed to reduce the ammine complex of silver salt.

As a method for producing hexagonal plate-like silver particles, a wet neutralization reduction method is illustrated. Specifically, there is a method for producing hexagonal plate-like crystalline silver particles, characterized in that a slurry comprising an ammine complex of silver salt and an ammine complex of heavy metal salt that functions as a habit modifier in reduction reaction, and a solution containing potassium sulfite, which is a reducing agent, and gelatin as a protective colloid are mixed at a time to reduce the ammine complex of silver salt, and produced silver particles are recovered.

The pasty silver particle composition of the present invention is a mixture of non-spherical silver particles (A) and a volatile dispersion medium (B), and the powdery non-spherical silver particles (A) are turned into a paste by the action of the volatile dispersion medium (B). By being turned into a paste, the paste can be discharged in a thin line shape from a cylinder or a nozzle, is also easily printed and coated with a metal mask, and is easily applied to the shape of an electrode. A volatile dispersion medium (B), rather than a nonvolatile dispersion medium, is used, because when the non-spherical silver particles (A) are sintered by heating, the non-spherical silver particles (A) are easily sintered if the dispersion medium is volatilized previously, and as a result, the strength, electrical conductivity, and thermal conductivity of solid silver increase easily. The volatile dispersion medium (B) does not alter the surface of the non-spherical silver particles, and its boiling point is preferably 60° C. or higher and 300° C. or lower, because if the boiling point is lower than 60° C., the solvent is easily volatilized during the operation of preparing a pasty silver particle composition, and if the boiling point is higher than 300° C., the volatile dispersion medium (B) may remain also after the non-spherical silver particles (A) are sintered.

As such an volatile dispersion medium (B), water; volatile monohydric alcohols, such as ethyl alcohol, propyl alcohol, butyl alcohol, pentyl alcohol, hexyl alcohol, heptyl alcohol, octyl alcohol, nonyl alcohol, decyl alcohol, and benzyl alcohol; other volatile alcohols; volatile aliphatic hydrocarbons, such as lower n-paraffin and lower isoparaffin; volatile aromatic hydrocarbons, such as toluene and xylene; volatile ketones, such as acetone, methyl ethyl ketone, methyl isobutyl ketone, cyclohexanone, diacetone alcohol (4-hydroxy-4-methyl-2-pentanone), 2-octanone, isophorone (3,5,5-trimethyl-2-cyclohexen-1-one), and dibutyl ketone (2,6-dimethyl-4-heptanone); volatile acetates, such as ethyl acetate and butyl acetate; volatile aliphatic carboxylates, such as methyl butyrate, methyl hexanoate, methyl octanoate, and methyl decanoate; volatile ethers, such as tetrahydrofuran, methyl cellosolve, propylene glycol monomethyl ether, methyl methoxy butanol, and butyl carbitol; and low molecular weight volatile silicone oil and volatile organic modified silicone oil are illustrated. Particularly, volatile monohydric alcohols, such as butyl alcohol, pentyl alcohol, hexyl alcohol, heptyl alcohol, octyl alcohol, nonyl alcohol, decyl alcohol, and benzyl alcohol, are preferable, because these volatile alcohols having 4 to 10 carbon atoms provide excellent printing property with a metal mask and excellent extrusion property and discharge property from a syringe, when formed into a pasty silver particle composition, and also have moderate volatility. Next, volatile aliphatic hydrocarbons, such as lower n-paraffin and lower isoparaffin, are preferable. Water is preferably pure water, and its electrical conductivity is preferably 100 μS/cm or less, and more preferably 10 μS/cm or less. A method for producing pure water should be a usual method, and an ion exchange method, a reverse osmosis method, a distillation method, and the like are illustrated. Two or more types of the volatile dispersion media (B) may be used together, regardless of the compatibility of the volatile dispersion media.

The amount of the volatile dispersion medium (B) to be contained should be an amount enough to make the non-spherical silver particles (A) pasty. As a rough standard, it is 5 to 20 parts by weight per 100 parts by weight of the non-spherical silver particles (A), and preferably 6 to 14 parts by weight. Other than the non-spherical silver particles (A), a small amount or trace amount of reduced silver, atomized silver, a silver colloid, a silver alloy, a silver-coated powder, other metal and nonmetal powders, a metal compound and a metal complex, and additives, such as a thixotropic agent, a stabilizer, and a colorant, may be added to the pasty silver particle composition of the present invention, unless the object of the present invention is contradicted.

In the pasty silver particle composition of the present invention, the volatile dispersion medium (B) is volatilized and the non-spherical silver particles (A) are sintered by heating to provide solid silver having excellent strength, electrical conductivity, and thermal conductivity. At this time, the volatile dispersion medium (B) may be volatilized, and then non-spherical silver particles (A) may be sintered, or the non-spherical silver particles (A) may be sintered with the volatilization of the volatile dispersion medium (B). Since silver essentially has high strength and very high electrical conductivity and thermal conductivity, a sintered material of the non-spherical silver particles of the present invention also has high strength and very high electrical conductivity and thermal conductivity. The heating temperature at this time should be temperature at which the volatile dispersion medium (B) can be volatilized and the non-spherical silver particles (A) can be sintered, and it is usually 100° C. or higher, and more preferably 150° C. or higher. However, if the heating temperature is higher than 400° C., the volatile dispersion medium (B) is evaporated with bumping so that the shape of the solid silver can be adversely affected. Therefore, it needs to be 400° C. or lower, and is more preferably 300° C. or lower.

The electrical conductivity of the solid silver made by the sintering of the non-spherical silver particles (A) is preferably $1 \times 10^{-4}$ Ω·cm or less in volume resistivity, and more preferably $1 \times 10^{-5}$ Ω·cm or less. Its thermal conductivity is preferably 5 W/m·K or more, and more preferably 10 W/m·K or more. The shape of the solid silver made by the sintering of the non-spherical silver particles (A) is not specifically limited, and a sheet shape, film shape, tape shape, line shape, disc shape, block shape, spot shape, and indefinite shape are illustrated.

In the pasty silver particle composition of the present invention, the volatile dispersion medium (B) is volatilized and the non-spherical silver particles (A) are sintered by heating to provide solid silver having excellent strength, electrical conductivity, and thermal conductivity, and having adhesive property to a contacting metal member (for example, a metal substrate, such as a gold-plated substrate, a silver substrate, a silver-plated metal substrate, a copper substrate, an aluminum substrate, a nickel-plated substrate, and a tin-plated metal substrate; a metal portion, such as an electrode, on an electrically insulating substrate; a metal portion (for example, a terminal) of an electronic component, an electronic device, an electrical component, or an electrical device). Therefore, it is useful for joining a plurality of metal members, and is particularly useful for joining of a metal substrate or an electrode on an electrically insulating substrate and a metal portion (for example, a terminal) of an electronic component, an electronic device, an electrical component, or an electrical device. As such joining, the joining of a chip component, such as a capacitor and a resistor, and a circuit substrate; the joining of a semiconductor chip, such as a diode, a memory, and a CPU, and a lead frame or a circuit substrate; and the joining of a high heat generating CPU chip and a cooling plate are illustrated.

The pasty silver particle composition of the present invention does not need washing after it is heated to sinter the non-spherical silver particles (A), but it may be washed with water and an organic solvent. Particularly, when the volatile dispersion medium (B) is water or a hydrophilic solvent, it can be washed with water, therefore, there is no problem of VOC generation as in washing with an organic solvent, such as alcohol. Since each component of the pasty silver particle composition of the present invention has a small amount of impurities, washing is easy.

In the pasty silver particle composition of the present invention, the volatile dispersion medium (B) is volatilized and the non-spherical silver particles (A) are sintered by heating to provide solid silver having high strength and very high electrical conductivity and thermal conductivity, therefore, by applying the pasty silver particle composition to a substrate for printed wiring, to which a curable adhesive, for example, an epoxy resin adhesive, a silicone resin adhesive, or a polyimide resin adhesive is applied, or a substrate for printed wiring, to which a primer composition is applied and then a curable adhesive is applied, and heating them, before the adhesive is cured, silver wiring having excellent wear resistance and adhesive property to the substrate can be formed. A method for applying the pasty silver particle composition of the present invention is not specifically limited, and there are dispensing-coating, printing-coating, spray coating, brush coating, injection, and the like. Also, by mounting a chip and the like on the printed wiring board by the joining method described in the present application, a circuit board can be produced.

Since the pasty silver particle composition of the present invention contains the volatile dispersion medium (B), it is preferably stored in a closed container. When it is used after a long period of storage, it is preferably used after shaking the container or after stirring in the container. For the purpose of improving storage stability, it may be cold stored, and as storage temperature, 10° C. or lower is illustrated. When it is stored in a closed container, it is preferably stored at temperature at which the volatile dispersion medium (B) is not solidified.

EXAMPLES

The examples and comparative examples of the present invention are illustrated. In the examples and comparative examples, "parts" following a numeral means "parts by weight." The carbon content in silver particles, and the adhesive strength, volume resistivity, and thermal conductivity of solid silver produced by heating and sintering a pasty silver particle composition were measured by the following method at 25° C.

[Carbon Content]

Silver particles were heated in an oxygen gas flow by high-frequency waves to turn the carbon in the organic compound attached to the non-spherical silver particles into a carbonic acid gas, and the amount of the carbonic acid gas was measured by an infrared absorption spectrum method and converted to calculate a carbon content.

[Adhesive Strength]

A pasty silver particle composition was applied (application area: 0.6 mm×1.0 mm) to two 0.8 mm×1.2 mm land (pad) portions 4 (silver-plating finish) provided at a spacing of 1 mm on a 100 mm wide×40 mm long glass fiber-reinforced epoxy resin substrate 1, using a 150 μm thick metal mask, and the terminal electrodes 3 of a 2012 chip capacitor was mounted on the land (pad) portions 4 (silver-plating finish) by a chip mounter, then, they were heated in a forced circulation oven at 200° C. for 30 minutes. With the volatilization of alcohol or lower isoparaffin, the non-spherical silver particles in the pasty silver particle composition were sintered to join the land (pad) portions 4 and the terminal electrodes 3 of the 2012 chip capacitor (both ends have silver-plating finish). Thus obtained specimen for adhesive strength measurement was fixed, and a side of the chip capacitor 2 was pressed by an adhesive strength tester at a press speed of 23 mm/minutes to determine adhesive strength (unit: kgf and N) by load when the bonding portions were shear fractured. The number of times of the adhesive strength tests was five, and the average value of five tests was determined as adhesive strength.

[Volume Resistivity]

Using a metal mask having an opening having a width of 10 mm, a length of 50 mm, and a thickness of 100 μm, a pasty silver particle composition was printed and coated on an electrically insulating FR-4 glass fiber reinforced epoxy resin substrate, and heated in a forced circulation oven at 200° C. for 30 minutes. With the volatilization of alcohol or lower isoparaffin, the non-spherical silver particles in the pasty silver particle composition were sintered to form film-shaped silver. For this film-shaped silver, resistance was measured by applying a voltage of 10 volt between measurement ends with a distance of 50 mm, and volume resistivity (unit: Ω·cm) was calculated.

[Thermal Conductivity]

A pasty silver particle composition was interposed between 10 mm×10 mm square silicon wafers to be 40 μm or 80 μm thick, and heated in a forced circulation oven at 200° C. for 30 minutes. With the volatilization of alcohol or lower isoparaffin, the non-spherical silver particles in the pasty silver particle composition were sintered to form film-shaped silver. For this film-shaped silver, thermal resistance (unit: ° C./W) at each thickness was measured. The relationship between each thickness (unit: m) and thermal resistance was plotted on a graph to draw a straight line, and the slope was calculated as thermal conductivity (unit: W/mK).

Example 1

2 parts of 1-hexanol (a special grade reagent sold by Wako Pure Chemical Industries, Ltd.) was added to 20 parts of flake-like silver obtained by converting commercially available silver particles, that were produced by a reduction method, to flakes (primary particles had an average particle diameter of 3.0 μm, as measured by a laser diffraction method and a carbon content of 0.7 weight %, and the silver surface was coated with stearic acid), and they were mixed uniformly using a paddle to prepare a pasty silver particle composition. This pasty silver particle composition was able to be applied in a good shape without drips, runs, or the like, in application with a metal mask. This pasty silver particle composition was able to be easily discharged from an EFD syringe (which was manufactured by SAN-EI TECH Ltd., and a needle attached to a tip had an inner diameter of 1.55 mm, and the discharge pressure was 50 kPa). For this pasty silver particle composition, the adhesive strength, volume resistivity, and thermal conductivity of solid silver that was a heated and sintered material were measured, and the results were shown together in Table 1. Film-shaped silver used for the volume resistivity measurement had strength comparable to that of silver obtained by a smelting method. From the above results, it is understood that this pasty silver particle composition is useful for producing strong solid silver, for joining metal members strongly with good electrical conductivity and thermal conductivity, and for forming silver wiring having excellent wear resistance, adhesive property to a substrate, electrical conductivity, and thermal conductivity.

Example 2

A pasty silver particle composition was prepared in a manner similar to that of Example 1, except that lower isoparaffin having a distillation range of 106° C. to 202° C. (manufactured by Nippon Petrochemicals Co., Ltd., trade name: Isosol 300) was used instead of 1-hexanol in Example 1. This pasty silver particle composition was able to be applied in a good shape without drips, runs, or the like, in application with a metal mask. For this pasty silver particle composition, the adhesive strength, volume resistivity, and thermal conductivity of solid silver that was a heated and sintered material were measured, and the results were shown together in Table 1. Film-shaped silver used for the volume resistivity measurement had strength comparable to that of silver obtained by a smelting method. From the above results, it is understood that this pasty silver particle composition is useful for producing strong solid silver, for joining metal members strongly with good electrical conductivity and thermal conductivity, and for forming silver wiring having excellent wear resistance, adhesive property to a substrate, electrical conductivity, and thermal conductivity.

Example 3

2 parts of 1-octanol (a special grade reagent sold by Wako Pure Chemical Industries, Ltd.) was added to 20 parts of commercially available granular silver particles produced by a reduction method (primary particles had an average particle diameter of 2.7 μm, as measured by a laser diffraction method, and a carbon content of 0.9 weight %, and the silver surface was coated with stearic acid), and they were mixed uniformly using a paddle to prepare a pasty silver particle composition. This pasty silver particle composition was able to be applied in a good shape without drips, runs, or the like, in application with a metal mask. This pasty silver particle composition was able to be easily discharged from an EFD syringe (which was manufactured by SAN-EI TECH Ltd., and a needle attached to a tip had an inner diameter of 1.55 mm, and the discharge pressure was 50 kPa). The adhesive strength, volume resistivity, and thermal conductivity of solid silver that was a heated and sintered material were measured, and the results were shown together in Table 1. Film-shaped silver used for the volume resistivity measurement had strength comparable to that of silver obtained by a smelting method. From the above results, it is understood that this pasty silver particle composition is useful for producing strong solid silver, for joining metal members strongly with good electrical conductivity and thermal conductivity, and for forming silver wiring having excellent wear resistance, adhesive property to a substrate, electrical conductivity, and thermal conductivity.

Comparative Example 1

2 parts of 1-hexanol (a special grade reagent sold by Wako Pure Chemical Industries, Ltd.) was added to 20 parts of commercially available spherical silver particles produced by an atomization method (primary particles had an average particle diameter of 1.0 μm, as measured by a laser diffraction method, and a carbon content of 0.8 weight %, and the surface was not coated with a higher fatty acid), and they were mixed uniformly using a paddle to prepare a pasty silver particle composition. This pasty silver particle composition was able to be applied in a good shape without drips, runs, or the like, in application with a metal mask. For this pasty silver particle composition, a specimen for adhesive strength measurement, a specimen for volume resistivity measurement, and a specimen for thermal conductivity measurement were tried to be made, but the spherical silver particles were not sintered sufficiently, and the sintered material was brittle, and was easily broken when touched with a finger, therefore, specimens could not be made. Therefore, it was impossible to measure the adhesive strength, volume resistivity, and thermal conductivity of solid silver.

Comparative Example 2

2 parts of 1-hexanol (a special grade reagent sold by Wako Pure Chemical Industries, Ltd.) was added to 20 parts of flake-like silver particles from commercially available silver particles produced by a reduction method (primary particles had an average particle diameter of 20 μm, as measured by a laser diffraction method, and a carbon content of 0.5 weight %, and the silver surface was coated with stearic acid), and they were mixed uniformly using a paddle to prepare a pasty silver particle composition. This pasty silver particle composition was able to be applied in a good shape without drips, runs, or the like, in application with a metal mask. For this pasty silver particle composition, the adhesive strength, volume resistivity, and thermal conductivity of solid silver that was a heated and sintered material were measured, and the results were shown together in Table 1. Film-shaped silver that was a heated and sintered material used for the volume resistivity measurement had somewhat weak strength than silver obtained by a smelting method.

Comparative Example 3

2 parts of 1-hexanol (a special grade reagent sold by Wako Pure Chemical Industries, Ltd.) was added to 20 parts of flake-like silver particles from commercially available silver particles produced by a reduction method (primary particles had an average particle diameter of 2.4 μm, as measured by a laser diffraction method, and a carbon content of 1.6 weight %, and the silver surface was coated with linolenic acid), and they were mixed uniformly using a paddle to prepare a pasty silver particle composition. This pasty silver particle composition was able to be applied in a good shape without drips, runs, or the like, in application with a metal mask. For this pasty silver particle composition, a specimen for adhesive strength measurement, a specimen for volume resistivity measurement, and a specimen for thermal conductivity measurement were tried to be made, but the flake-like silver particles were not sintered sufficiently, and the sintered material was brittle, and was easily broken when touched with a finger, therefore, specimens could not be made. Therefore, it was impossible to measure the adhesive strength, volume resistivity, and thermal conductivity of solid silver.

[Table 1]

TABLE 1

|  | Example 1 | Example 2 | Example 3 | Comparative Example 1 | Comparative Example 2 | Comparative Example 3 |
| --- | --- | --- | --- | --- | --- | --- |
| Adhesive strength kgf (N) | 3.0 (29.42) | 2.5 (24.52) | 3.0 (29.42) | Unmeasurable | 0.1 (0.98) | Unmeasurable |
| Volume resistivity $\Omega \cdot cm$ | $5 \times 10^{-6}$ | $5 \times 10^{-6}$ | $5 \times 10^{-6}$ | Unmeasurable | $3 \times 10^{-1}$ | Unmeasurable |
| Thermal conductivity W/mK | 45 | 35 | 40 | Unmeasurable | 1 | Unmeasurable |

INDUSTRIAL APPLICABILITY

The pasty silver particle composition, the process for producing solid silver, the solid silver, and the joining method according to the present invention are useful for the formation of an electrically conductive circuit on a printed circuit substrate; the formation of electrodes of various display elements and various electronic components, such as a resistor and a capacitor; the formation of an electrically conductive film for an electromagnetic wave shield; the joining of a chip component, such as a capacitor, a resistor, a diode, a memory, and an arithmetic element (CPU), to a substrate; the formation of electrodes of a solar cell; the formation of external electrodes of a chip-type ceramic electronic component, such as a laminated ceramic capacitor, a laminated ceramic inductor, and a laminated ceramic actuator; and the like. The process for producing a wiring board according to the present invention is useful for efficiently producing a printed wiring board having silver wiring.

The invention claimed is:

1. A pasty silver particle composition, characterized by comprising (A) non-spherical silver particles having an average particle diameter of 0.1 to 18 μm, a surface at least partially coated with a higher fatty acid or its derivative, and wherein the coated particles have a non-zero carbon content of 1.0 weight % or less, wherein the ratio of silver oxide on the surface of the silver particles to silver particle surface area is less than 50%; and (B) a volatile dispersion medium having a boiling point from 100° C. to 400° C. in an amount sufficient to make the non-spherical silver particles of (A) pasty, selected from: water; a volatile monohydric alcohol selected from the group consisting of ethyl alcohol, propyl alcohol, butyl alcohol, pentyl alcohol, hexyl alcohol, heptyl alcohol, octyl alcohol, nonyl alcohol, decyl alcohol, and benzyl alcohol; an ether; aliphatic carboxylic acid ester; or aliphatic hydrocarbon solvent.

2. The pasty silver particle composition according to claim 1, characterized in that the non-spherical silver particles are flake-like silver particles or granular silver particles.

3. A process for producing solid silver, characterized by comprising heating the pasty silver particle composition according to claim 1 at 100° C. or higher and 400° C. or lower, whereby the volatile dispersion medium is volatilized and the silver particles are sintered.

4. Solid silver characterized in that solid silver produced by the producing process according to claim 3 has a volume resistivity of $1 \times 10^{-5}$ $\Omega \cdot cm$ or less and a thermal conductivity of 10 W/m·K or more.

5. A joining method characterized by comprising interposing the pasty silver particle composition according to claim 1 between a plurality of metal members and heating at 100° C. or higher and 400° C. or lower, whereby the volatile dispersion medium is volatilized and the silver particles are sintered to join the plurality of metal members.

6. The joining method according to claim 5, characterized in that the plurality of metal members are a metal substrate or an electrode on an electrically insulating substrate, and a metal portion of an electronic component or an electrical component.

7. A process for producing a printed wiring board, characterized by comprising applying the pasty silver particle composition comprising (A) non-spherical silver particles having an average particle diameter of 0.1 to 18 μm, a surface at least partially coated with a higher fatty acid or its derivative, and a carbon content of 1.0 weight % or less and (B) a volatile dispersion medium on a substrate, to which an adhesive is applied, and heating at 100° C. or higher and 400° C. or lower before the adhesive is cured, whereby the volatile dispersion medium is volatilized and the silver particles are sintered and simultaneously the adhesive is cured to form silver wiring.

8. The pasty silver particle composition according to claim 1, characterized in that the amount of the volatile dispersion medium (B) is 5 to 20 parts by weight per 100 parts by weight of the non-spherical silver particles (A).

9. The process of claim 7, wherein the volatile dispersion medium has a boiling point between 100° C. and 400° C.

10. The past silver composition of claim 1, wherein the ratio of silver oxide on the surface of the silver particles to silver particle surface area is less than 20%.

11. The past silver composition of claim 1, wherein the ratio of silver oxide on the surface of the silver particles to silver particle surface area is less than 2%.

* * * * *